United States Patent [19]
Yamauchi et al.

[11] Patent Number: 5,940,677
[45] Date of Patent: Aug. 17, 1999

[54] FABRICATING METHOD FOR SEMICONDUCTOR DEVICE

[75] Inventors: Satoshi Yamauchi; Shinobu Takehiro; Masaki Yoshimaru, all of Tokyo, Japan

[73] Assignee: Oki Electric Industry Co., Ltd., Tokyo, Japan

[21] Appl. No.: 09/081,562

[22] Filed: May 19, 1998

[30] Foreign Application Priority Data

Oct. 17, 1997 [JP] Japan ..................................... 9-285715

[51] Int. Cl.$^6$ ................................................. H01L 21/8242
[52] U.S. Cl. ................................ 438/3; 438/253; 438/240
[58] Field of Search ................................ 438/3, 250–256, 438/393–398, 381, 239–240; 257/295

[56] References Cited

U.S. PATENT DOCUMENTS 5,555,486  9/1996  Kingon et al. .
5,580,814 12/1996  Larson .

FOREIGN PATENT DOCUMENTS 7-50395  2/1995  Japan .

OTHER PUBLICATIONS

S. Yamamichi et al., "An ECR MOCVD (Ba,Sr)TiO3 based stacked capacitor technology with RuO2/Ru/TiN/TiSix storage nodes for Gbit-scale DRAMs," 1995 IEEE, IEDM 95-119 through IEDM 95-122, 1995.

K.P. Lee et al., "A Process Technology for 1 Giga-Bit DRAM," 1995 IEEE, IEDM 95-907 through IEDM 95-910, 1995.

*Primary Examiner*—Jey Tsai
*Attorney, Agent, or Firm*—Jones, Volentine, Steinberg & Whitt, L.L.P.

[57] ABSTRACT

In a process where a capacitor using a BST film for a dielectric film is incorporated into a DRAM, the film is selectively removed by wet etching for forming a contact hole. For this purpose, a bottom electrode is formed and then an amorphous film is formed on the entire surface of a silicon wafer. And after forming a crystalline top electrode on this film, lamp heating is performed to crystallize only the area that is in contact with the electrode. Then wet etching is performed using a solution of hydrogen and ammonium fluoride (1:2), which allows removing only the amorphous area selectively.

9 Claims, 12 Drawing Sheets

FABRICATING METHOD FOR SEMICONDUCTOR DEVICE

BACKGROUND OF THE INVENTION

1. Field of the Invention

The present invention relates to a fabrication method for a semiconductor device that has a capacitor formed on a semiconductor substrate.

2. Description of the Related Art

A semiconductor device that has a capacitor incorporated into an integrated circuit, such as DRAM (Dynamic Random Access Memory), has been known.

Recently, technology to use $BaTiO_3$ and $SrTiO_3$ for a dielectric film of the capacitor is being proposed.

For example, the following documents disclose such technology.

(1) S. Yamamichi et al., 1995 IEDM Technical Digest, p. 119

(2) K. P. Lee et al., 1995 IEDM Technical Digest, p. 910

(3) Japanese Laid-open Publication No. 50395/95

As above documents (1) and (2) disclose, the use of $BaTiO_3$ and $SrTiO_3$ for a dielectric film improves insulation performance of the dielectric film, and as a consequence, a capacitor with high dielectric constant can be fabricated for a semiconductor device with a high degree of integration. This technology is expected to be adopted for such a semiconductor device as giga bit scale large capacity DRAM.

Also, as above document (3) discloses, when two or more capacitors are formed by two or more pairs of top electrode and bottom electrode and one layer of $BaTiO_3$ dielectric film, parasitic capacitance can be decreased by forming an area of the dielectric film, that does not contact the top electrode and the bottom electrode, to be amorphous for dropping dielectric constant.

FIG. 12 is a cross-section depicting the structure of major sections of a conventional DRAM.

FIG. 12 shows a silicon dioxide film 1202 used as a device isolation film and diffusion layers 1203a and 1203b which are part of MOS transistors on the surface of a silicon wafer 1201. On the entire surface of the wafer 1201, a layer insulation film 1204, a SiN film 1205, a layer interconnect film 1206a, for instance, made from polysilicon, and a conductive layer made from Ru, $RuO_2$ or Pt are formed. The layer interconnect film 1206a and the conductive layer 1206b compose a bottom electrode 1206.

A dielectric film 1207 and a top electrode 1208 are laminated on the conductive layer 1206b and on the SiN film 1205. And a layer insulation film 1209 is formed on the top electrode 1208 and on the dielectric film 1207.

On the surface of the insulation film 1209, interconnect patterns 1210 and 1211 are formed. The interconnect pattern 1210 and the diffusion layer 1203b are connected with a layer interconnect film 1212, and the interconnect pattern 1211 and the top electrode 1208 are connected with a layer interconnect film 1213.

In order to form the film 1212 in the DRAM that has such structure, a contact hole that penetrates through films 1204, 1205, 1207 and 1209 must be formed.

When the dielectric film 1207 comprises of the $BaTiO_3$ film or the $SrTiO_3$ film, however, it is difficult to remove the dielectric film 1207 by dry etching, such as RIE (Reactive Ion Etching), therefore forming the contact hole is difficult. This is because a compound that is generated by Ba, Sr or Ti, and the etching gas component (e.g. Cl) has a high melting point, that is, low volatility.

If wet etching is used instead, the dielectric film 1207 that comprises of $BaTiO_3$ and $SrTiO_3$ can be removed easily. However, it is difficult to use wet etching for a DRAM that has a high degree of integration, because anisotropy of wet etching is small.

The technology disclosed in above document (3), which merely alters a part of a dielectric film that comprises $BaTiO_3$ and other components to be amorphous, can decrease the dielectric constant of parasitic capacitance, but cannot eliminate the parasitic capacitance completely. This technology still can not solve the problem that the forming of the above mentioned contact hole is difficult.

Although DRAM is used here as an example for explanation, this kind of problem always occurs to semiconductor devices that have a high degree of integration.

SUMMARY OF THE INVENTION

An object of the present invention is to provide a method for easily and accurately removing a dielectric film of a capacitor of a semiconductor device using wet etching.

For this purpose, the present invention comprises: the step (a) of forming a bottom electrode that has a layer interconnect film formed on a layer insulation film on a semiconductor substrate, and a conductive pattern formed on the layer insulation film contacting with the layer interconnect film; the step (b) of forming an amorphous or crystalline dielectric film on the layer insulation film and on the conductive pattern; the step (c) of forming a top electrode at a specified area on the dielectric film; the step (d) of altering the dielectric film so that at least the area under the top electrode becomes crystalline and the other area becomes amorphous; and the step (e) of removing a part or all of the amorphous area of the dielectric film by wet etching using an etchant that has an etch rate for amorphous that is higher than the etch rate for crystal.

If this fabrication method is used, etching will be easy because wet etching is used, and etching with sufficient anisotropy will be possible because the etchant to be used has an etch rate for amorphous that is higher than the etch rate for crystal.

BRIEF DESCRIPTION OF THE DRAWINGS

Further objectives and advantages of the present invention will now be described with references to the accompanying drawings.

DESCRIPTION OF THE PREFERRED EMBODIMENTS

Figure 1A:
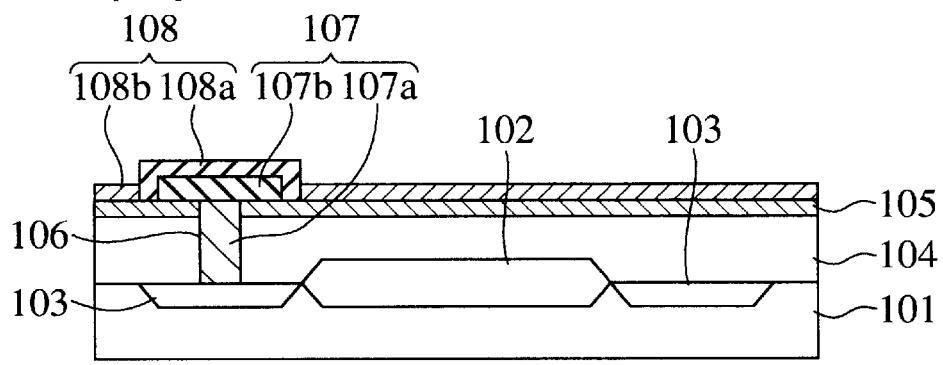
FIGS. 1A–1D and FIGS. 2A–2D are cross-sectional views of the processes depicting the fabrication method for semiconductor devices in accordance with the first embodiment.

Referring to the drawings, an embodiment of the invention will now be described by way of example, in which the invention is applied to a DRAM. A size, shape and positional relationship of each constituent in the drawings are roughly illustrated merely to help understand the invention, and numerical conditions to be described in the following description are merely examples.

First Embodiment

A fabrication method in accordance with the first embodiment of the present invention is described below referring to FIG. 1 to FIG. 5.

FIG. 1 and FIG. 2 are cross-sectional views of the processes depicting a fabrication method for a DRAM in accordance with the first embodiment.

(1) First, a $SiO_2$ film 102 to be a device isolation film and a diffusion layer 103 which is a layer to be a part of an MOS transistor or a similar device are formed on the surface of a silicon wafer 101. On the entire surface of this wafer 101, a e.g. 700~1000 nm thick $SiO_2$ film to be a layer insulation film and a e.g. 10~100 nm thick amorphous SiN film 105 are formed by such a method as CVD (Chemical Vapor Deposition).

A contact hole 106 is then formed at the $SiO_2$ film 104 and the SiN film 105 by ordinary photolithography technology or the like. Then polysilicon is deposited on the entire surface by such a method as sputtering, and a layer interconnect film 107a is formed by performing etch back on the surface. On this layer, a conductive layer 107b comprising a barrier layer and at least one of Ru, $RuO_2$, Ir, $IrO_2$ and Pt layer (crystal film) is formed by a deposition technology, such as CVD, and a patterning technology, so that the overall thickness becomes e.g. 20~100 nm. This conductive layer 107b and the above described interconnect film 107a compose a bottom electrode 107.

Then using a CVD method or the like, a BST (Barium Strontium Titantate) film 108 with thickness e.g. 20~100 nm is formed on the entire surface. The BST film 108 can be formed to be crystalline on a crystal film and to be amorphous on an amorphous film by setting the deposition temperature to be 500° C. or less. In this embodiment, the layer 107b is crystalline and the film 105 is amorphous, therefore the crystal BST film 108a is formed on the layer 107b, and the amorphous BST film 108b is formed on the film 105 (see FIG. 1(A)). If the deposition temperature is set to 500° C. or more, both BST film on the conductive layer 107b and the BST film on the SiN film 105 will be crystallized.

Figure 1B:
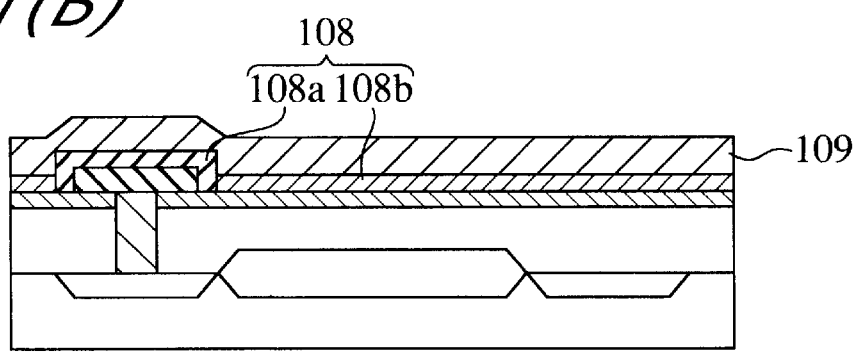

(2) Using a sputtering method, CVD method, or another method, a layer 109 made from at least one of Ru, $RuO_2$, Ir, $IrO_2$ and Pt, is formed on the entire surface of the BST film 108, such that the overall thickness becomes e.g. 30~200 nm (See FIG. 1(B)).

Figure 1C:
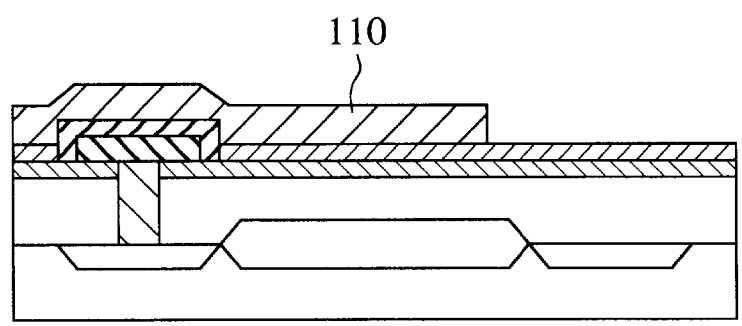
Figure 1D:
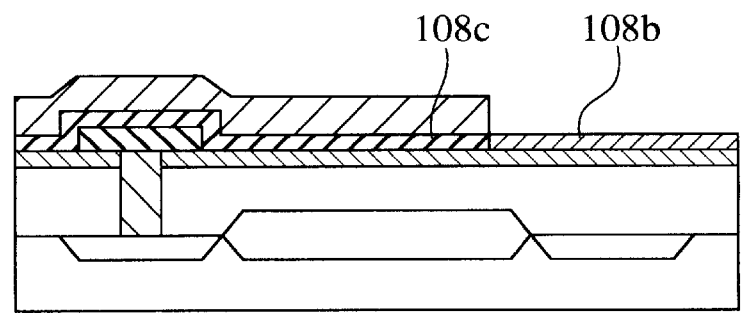

(3) By patterning this layer 109 using ordinary photolithography or the like, a top electrode 110 is formed (see FIG. 1(C)).

(4) The entire surface is heated with a lamp at e.g. 400° C. By this processing, only an area of the above described amorphous film 108b, that is in contact with the electrode 110, is crystallized and becomes a crystal film 108c (see FIG. 1(D)).

Figure 3:
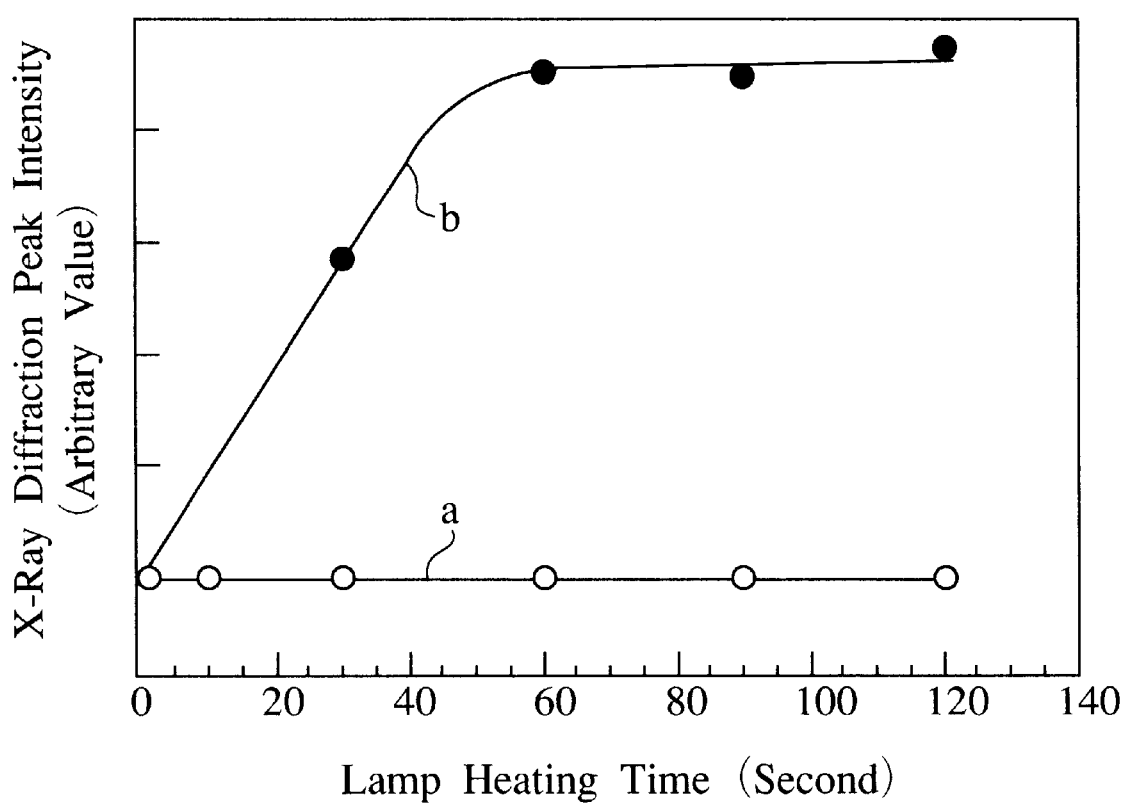
FIG. 3 is a graph indicating the relationship between lamp heating processing time and the crystallization speed of the dielectric film in accordance with the first embodiment.

FIG. 3 is a graph indicating the relationship between the lamp heating processing time and the crystallization speed of the BST film 108b. In FIG. 3, the abscissa indicates the lamp heating time, and the ordinate indicates the x-ray diffraction peak intensity (arbitrary value) of the BST film 108b.

As the symbol a shows in FIG. 3, the portion of the BST film 108b, that is not contacting the electrode 110, is not crystallized even if heated with the lamp. On the other hand, the portion contacting the electrode 110 is completely crystallized by 400° C. lamp heating for approximately 60 seconds, as the symbol b in FIG. 3 shows.

Thus lamp heating after forming the crystal film 110 on the amorphous film 108b makes it possible to selectively crystallize the amorphous film in the area contacting the crystal film 110.

Figure 2A:
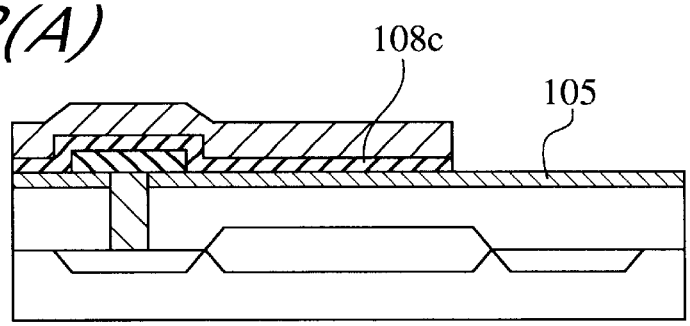

(5) Only the amorphous area of the BST film 108b is removed by wet etching (see FIG. 2(A)). Any etchant can be used here if the etch rate for amorphous is higher than the etch rate for crystal, and a solution of hydrogen and ammonium fluoride (1:2) is used in this embodiment.

Figure 4:
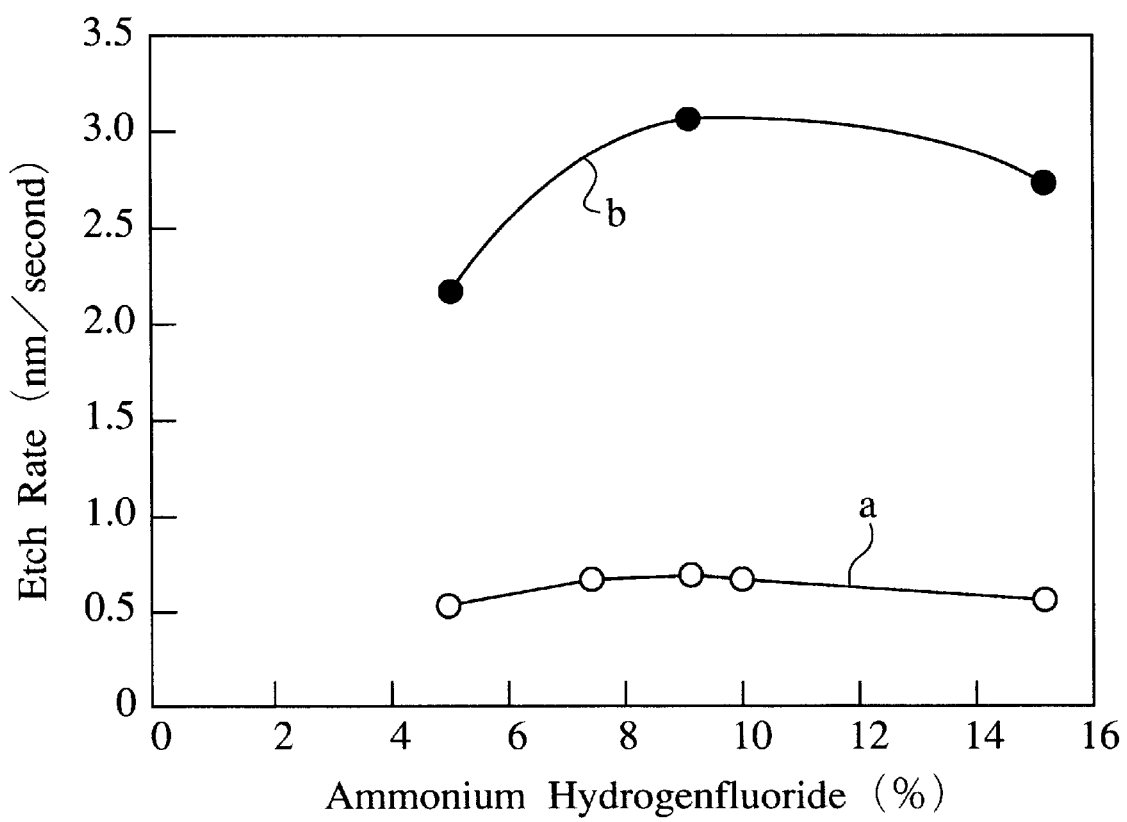
FIG. 4 and FIG. 5 are graphs for describing the effect of the first embodiment.

FIG. 4 is a graph indicating the etch rate when a solution of hydrogen and ammonium fluoride (1:2) is used as the etchant for the BST film, where the abscissa indicates the concentration of the hydrogen and ammonium fluoride (1:2), and the ordinate indicates the etch rate.

As FIG. 4 shows, when a solution of hydrogen and ammonium fluoride (1:2) is used as the etchant, the etch rate for crystal (see symbol a) is higher than the etch rate for amorphous (see symbol b) regardless the concentration.

Figure 5:
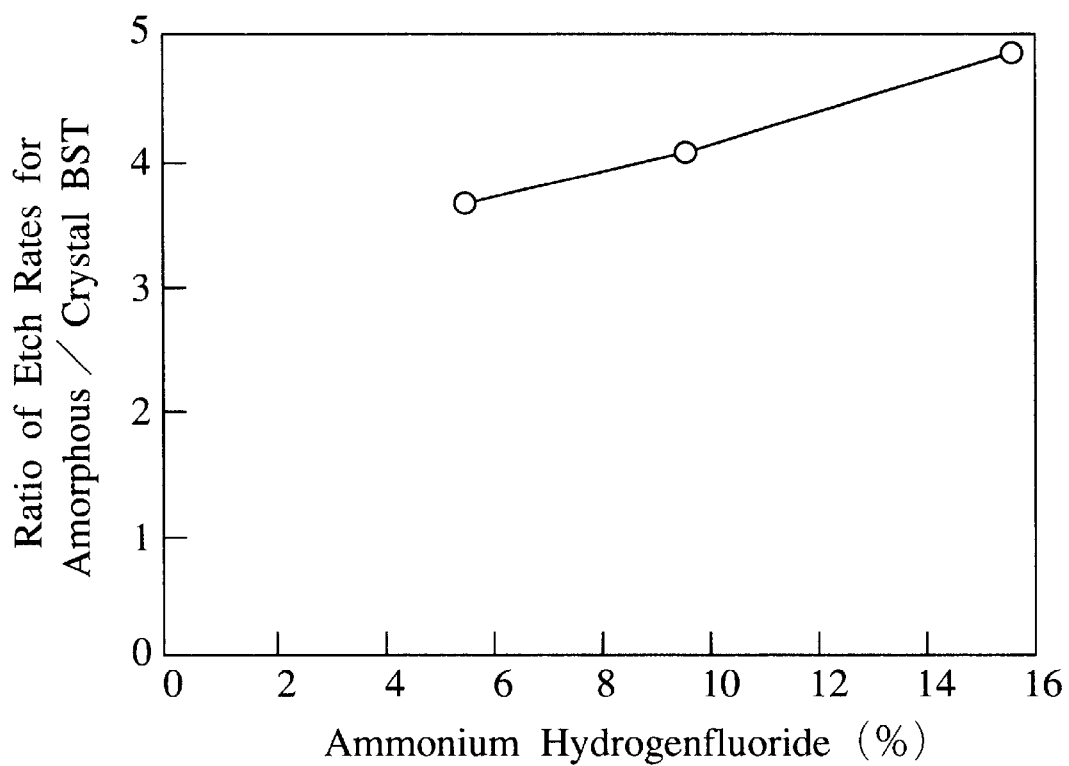

FIG. 5 is a graph indicating the ratio of the etch rate for crystal and the etch rate for amorphous when the solution of hydrogen and ammonium fluoride (1:2) is used as the etchant of the BST film, where the abscissa indicates a concentration of the hydrogen and ammonium fluoride (1:2) and the ordinate indicates the ratio of the etch rates.

As FIG. 5 shows, the use of the solution of hydrogen and ammonium fluoride (1:2) for the enchant makes the etch rate for amorphous three times or more that of the etch rate for crystal. This allows controlling the etched depth into the crystal film 108c to be under ⅓ the film thickness of the film 108 when the amorphous film 108b is removed.

Figure 2B:
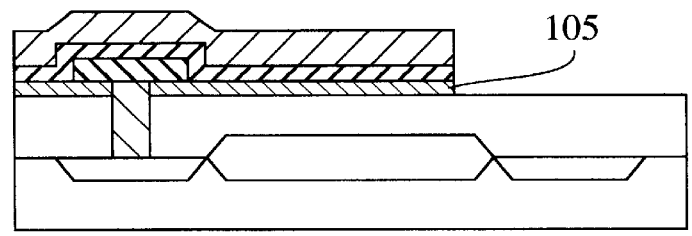

(6) Only the exposed area of the SiN film 105 is removed next, using RIE or the like (see FIG. 2(B)).

Figure 2C:
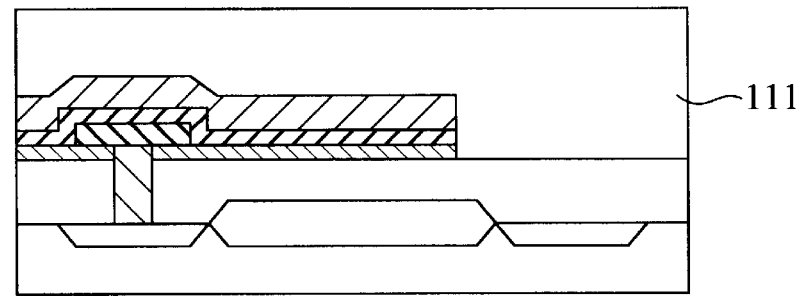
Figure 2D:
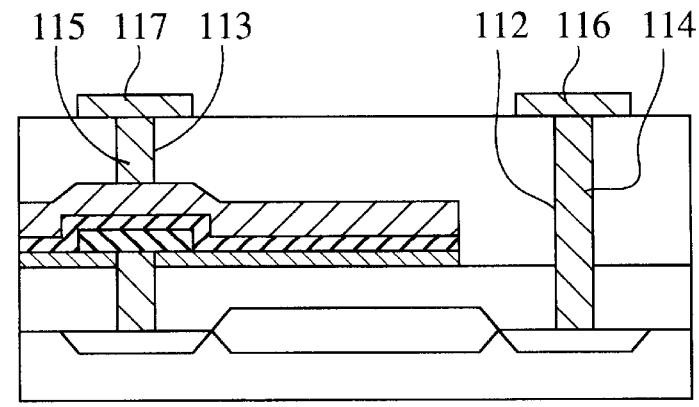

(7) A $SiO_2$ film 111 to be a layer insulation film is formed on the entire surface by CVD or the like (see FIG. 2(C)).

(8) Finally, a contact hole 112 and a throughhole 113 are formed on the $SiO_2$ film 111 using ordinary photolithography technology or the like. And after depositing polysilicon on the entire surface by such a method as a sputtering method, layer interconnect films 114, 115 and interconnect patterns 116, 117 are formed by patterning using ordinary photolithography or the like.

In this embodiment, the contact hole 112 is formed after removing the SiN film 105 (see above described processes (6) and (8)), but another opening can be formed at the film 105 during etching for forming the contact hole 112, without removing the film 105.

Thus in this embodiment, lamp heating is performed after forming the electrode 110 on the amorphous film 108b for crystallizing only the amorphous film portion contacting the electrode 110, and in the subsequent etching process, wet etching is performed using a solution of hydrogen and ammonium fluoride (1:2). This makes it possible to selectively remove the amorphous film 108b (that is, a portion of the BST film where the electrode 110 is not formed).

This method is also effective to prevent the generation of parasitic capacitance because the BST film in the area where the capacitor is not formed can be completely removed.

Second Embodiment

Figure 6A:
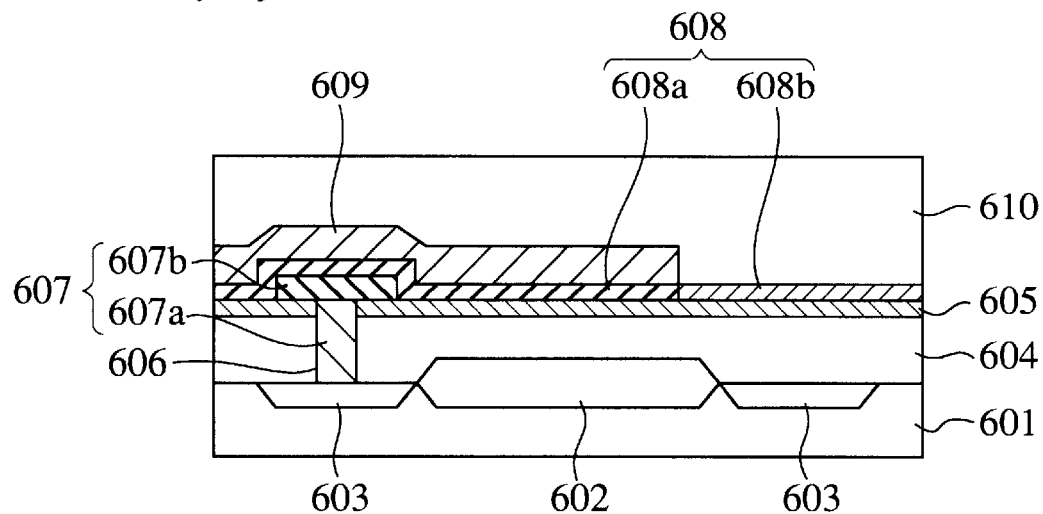
FIGS. 6A–6C, 7A–7C, 8A–8C, 9A–9C are cross-sectional views of the processes depicting the fabrication method for the semiconductor devices in accordance with the second embodiment.

A fabrication method in accordance with the second embodiment of the present invention is described below, referring to FIG. 6 and FIG. 7.

Figure 6B:
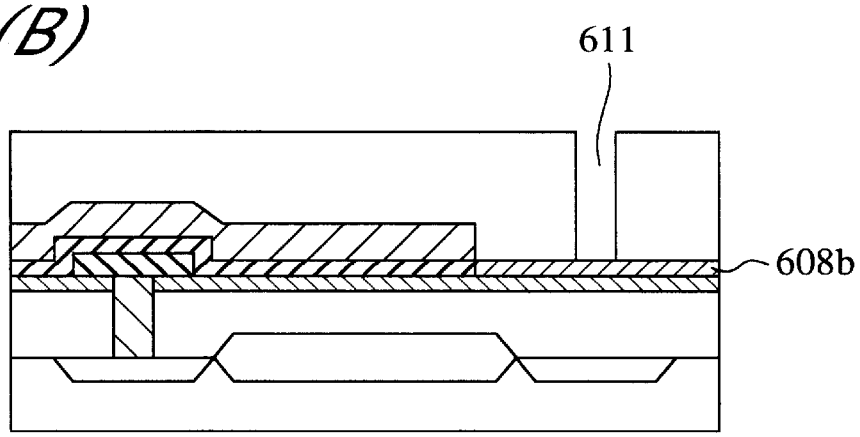
Figure 6C:
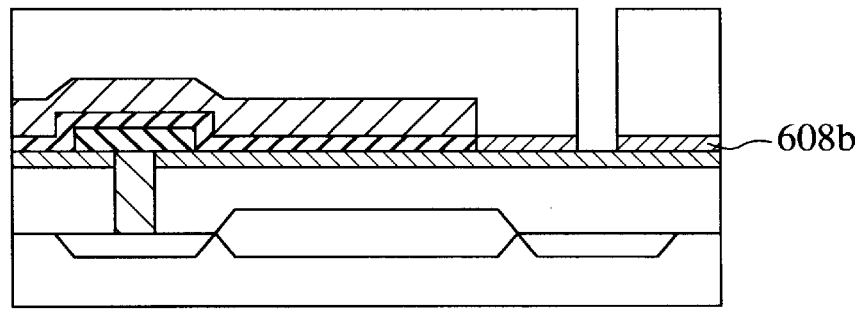
Figure 7A:
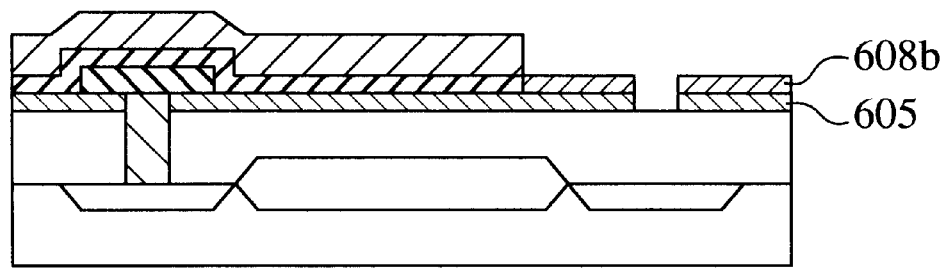
Figure 7B:
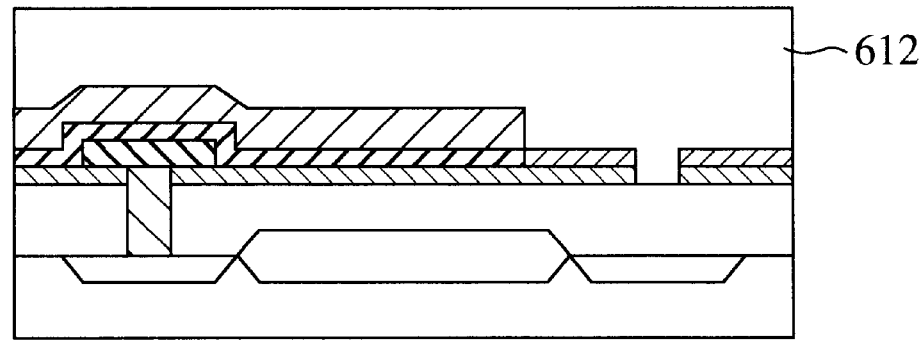
Figure 7C:
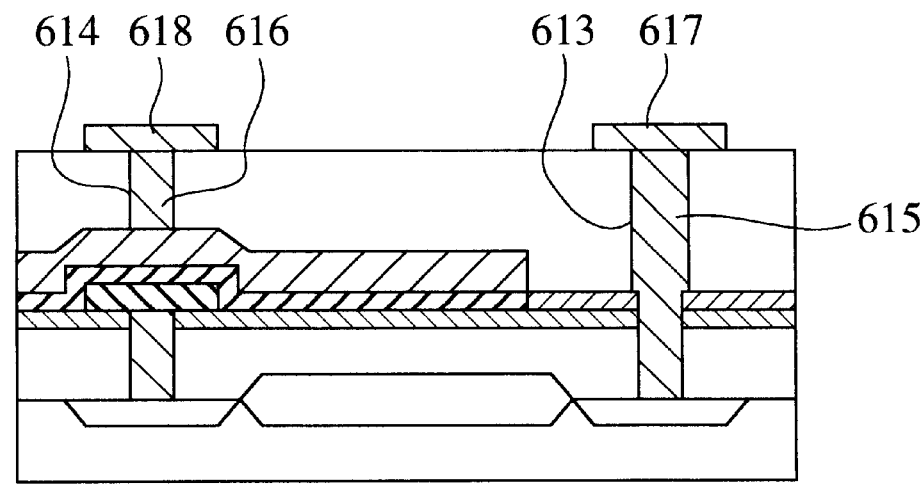

FIG. 6 and FIG. 7 are cross-sectional views of the processes depicting a fabrication method for a DRAM in accordance with the second embodiment.

(1) First, a $SiO_2$ film 602 to be a device isolation film, a diffusion layer 603, a $SiO_2$ film 604 to be a layer insulation film, and an amorphous SiN film 605 are sequentially formed on the surface of a silicon wafer 601, in the same manner as the first embodiment, then a contact hole 606 is formed at the $SiO_2$ film 604 and the SiN film 605 by ordinary photolithography technology or the like. And a bottom electrode 607 is formed by forming a layer interconnect film 607*a* and a conductive layer 607*b* that have the same configuration as those in the first embodiment.

Then a BST film 608 where the area contacting the electrode 607 is crystalline and the other area is amorphous is formed in the same manner as the first embodiment, and a top electrode 609, that has the same configuration as that in the first embodiment, is formed. Then lamp heating is performed in the same manner as the first embodiment to form the BST film where the area 608*a* that is contacting the electrode 609 is crystalline and the other area 608*b* is amorphous. And a $SiO_2$ film 610 is formed on the entire surface (see FIG. 6(A)).

(2) A throughhole 611 is formed by such a method as ordinary dry etching, so that a part of the amorphous film 608*b* is exposed (see FIG. 6(B)).

(3) The exposed portion of the amorphous film 608*b* is removed by wet etching (see FIG. 6(C)). In this embodiment, too, a solution of hydrogen and ammonium fluoride (1:2) can be used as the etchant.

(4) After removing the exposed portion of the SiN film 605 by ordinary dry etching technology or the like, all the film 610 is removed (see FIG. 7(A)).

(5) A $SiO_2$ film 612 to be a layer insulation film is formed on the entire surface using such a method as CVD (see FIG. 7(B)).

(6) Finally a contact hole 613 and a throughhole 614 are formed at the film 612 using ordinary photolithography technology or the like. And after depositing polysilicon on the entire surface by such a method as a sputtering method, layer interconnect films 615, 616, and interconnect patterns 617, 618 are formed by patterning using ordinary photolithography or the like.

Thus in this embodiment, too, lamp heating is performed after forming the electrode 610 on the amorphous BST film 608*b* for crystallizing only the portion of the BST film contacting the electrode 609, and in the subsequent etching process, wet etching is performed using a solution of hydrogen and ammonium fluoride (1:2). Therefore in this embodiment, only a desired area of the BST film 608*b* can be removed with a simple process.

Third Embodiment

Figure 8A:
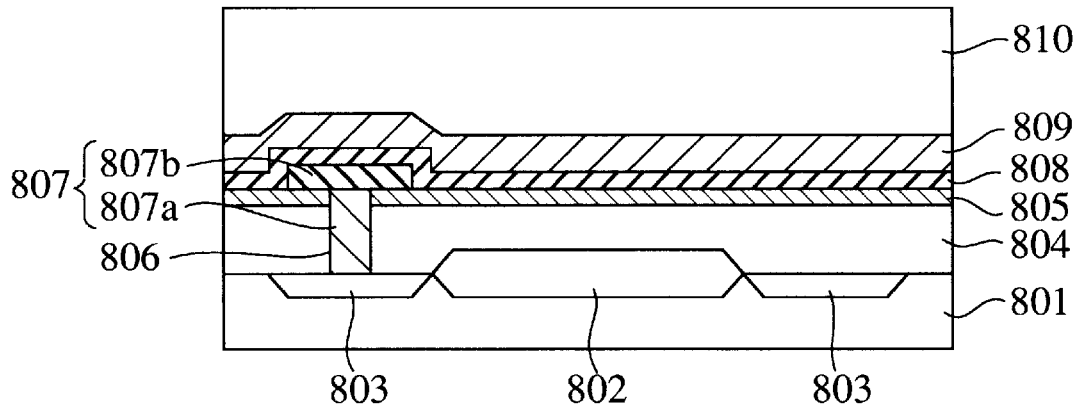
Figure 8B:
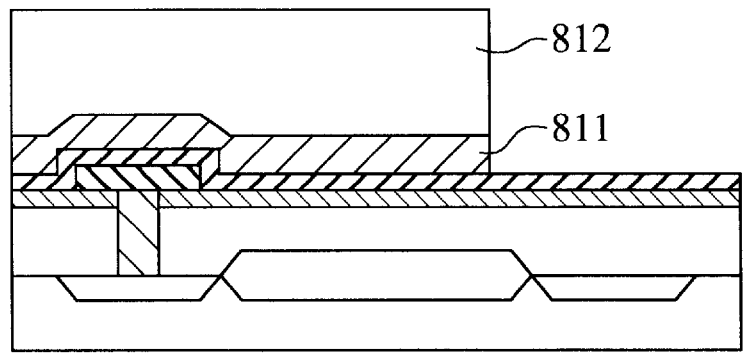

A fabrication method in accordance with the third embodiment of the present invention is described below, referring to FIG. 8 and FIG. 9.

Figure 8C:
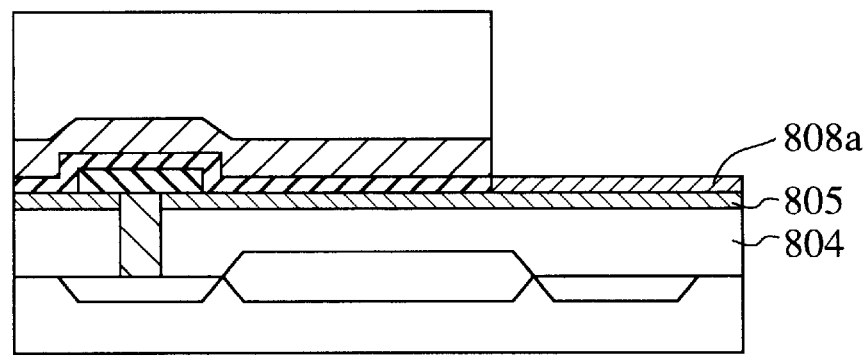
Figure 9A:
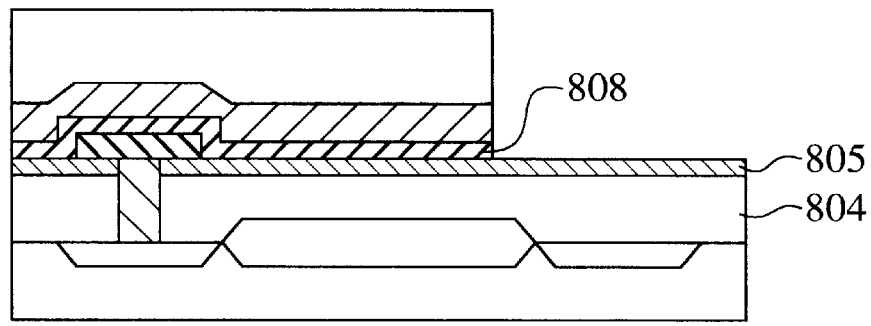
Figure 9B:
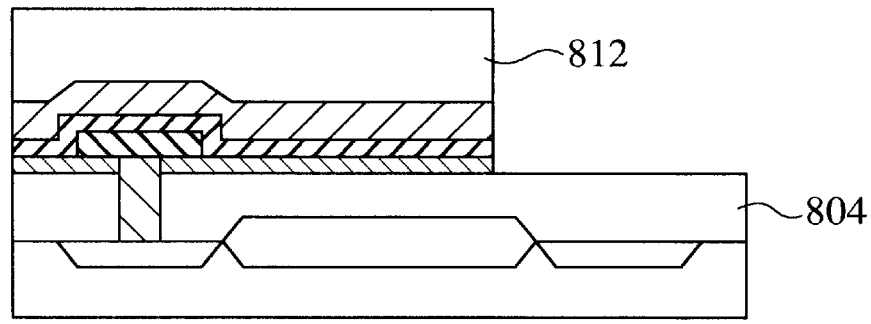
Figure 9C:
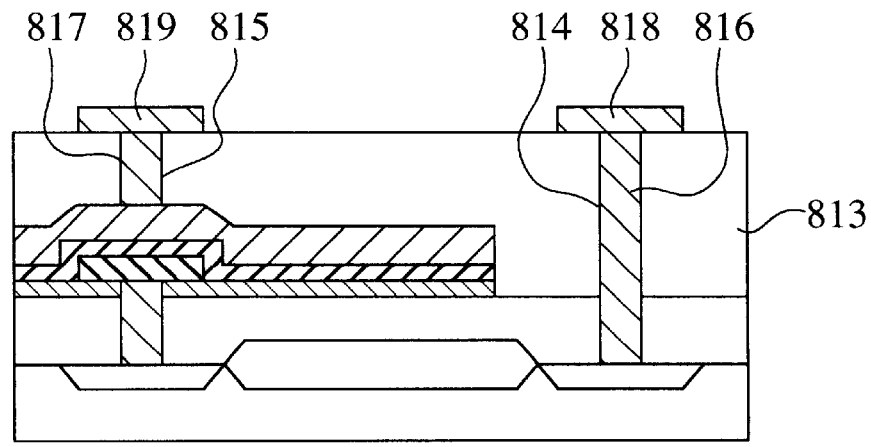

FIG. 8 and FIG. 9 are cross-sectional views of the processes depicting a fabrication method for a DRAM in accordance with the third embodiment.

(1) First, a $SiO_2$ film 802 to be a device isolation film, a diffusion layer 803, a $SiO_2$ film 804 to be a layer insulation film, and an amorphous SiN film 805 are sequentially formed on the surface of a silicon wafer 801, in the same manner as the first and second embodiments, then a contact hole 806 is formed at the film 804 and the film 805 by ordinary photolithography technology or the like. And a bottom electrode 807 is formed by forming a layer interconnect film 807*a* and a conductive layer 807*b* that have the same configuration as those in the first embodiment.

Then a BST film 808 which has a e.g. 20~100 nm thickness is formed on the entire surface using a CVD method, reactive sputtering method or another method. In this embodiment, this BST film 808 is formed to be crystalline by setting the deposition temperature to be 500° C. or more.

Using a sputtering method, CVD method or another method, the layer 809 made from at least one of Ru, $RuO_2$, Ir, $IrO_2$ and Pt is formed on the entire surface of the BST film 808, such that the overall thickness becomes e.g. 30~200 m.

Then a $SiO_2$ layer 810 is formed on the entire surface using such a method as CVD (see FIG. 8(A)).

(2) By patterning the layers 809 and 810 using ordinary patterning technology or the like, a top electrode 811 and a mask pattern 812 are formed (see FIG. 8(B)).

(3) Ar ions or the like are implanted into the entire surface with a 10~20 kV acceleration voltage and $1 \times 10^{13} \sim 1 \times 10^{15}$ dosage, for example. This applies ion bombardment on the exposed area of the BST film 808, and the amorphous area 808a is formed (see FIG. 8 (C)).

(4) Only the amorphous area 808a is removed by wet etching (see FIG. 9 (A)). In this embodiment, too, any etchant can be used if its etch rate for amorphous is higher than the etch rate for crystal, a solution of hydrogen and ammonium fluoride (1:2), for example.

(5) The exposed portion of the film 805 is removed by RIE or the like (see FIG. 9 (B)).

(6) After removing the mask pattern 812, a $SiO_2$ film 813 to be a layer insulation film is formed. And after forming a contact hole 814 and a throughhole 815 at this film 813, layer interconnect films 816, 817 and interconnect patterns 818, 819 are formed in the same manner as the first embodiment (see FIG. 9(C)).

In this embodiment, the contact hole 814 is formed after removing the film 805 (see above described processes (6) and (8)), but another opening can be formed at the film 805 during etching for forming the contact hole 814, without removing the film 805.

Thus, in this embodiment, Ar ions are implanted into the specified area of the crystal BST film 808 to alter the area to be amorphous, and in the subsequent etching process, wet etching is performed using a solution of hydrogen and ammonium fluoride (1:2). This makes it possible to selectively remove the amorphous area 808*a* of the BST film 808.

This method is also effective to prevent the generation of parasitic capacitance because the BST film in the area where the capacitor is not formed can be completely removed.

Fourth Embodiment

A fabrication method in accordance with the fourth embodiment of the present invention is described below, referring to FIG. 10 and FIG. 11.

Figure 10A:
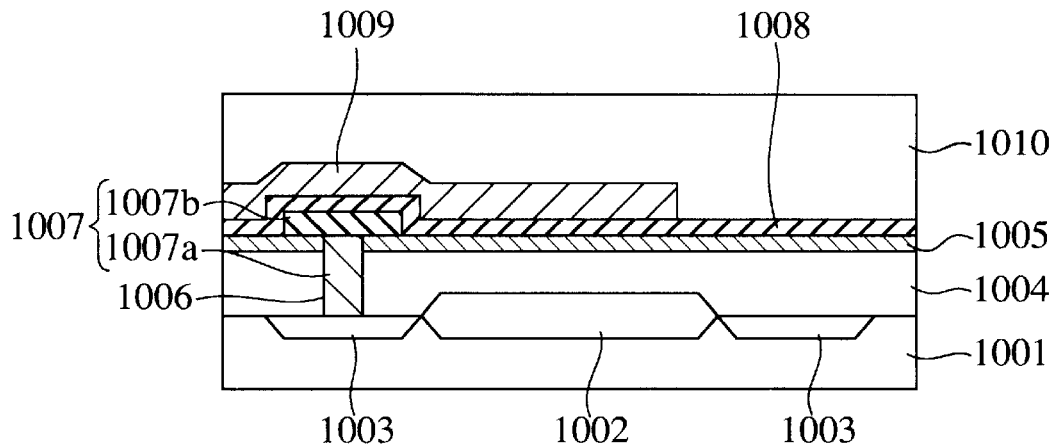
FIGS. 10A–10C and FIGS. 11A–11C are cross-sectional views of the processes depicting the fabrication method for the semiconductor devices in accordance with the fourth embodiment.
Figure 10B:
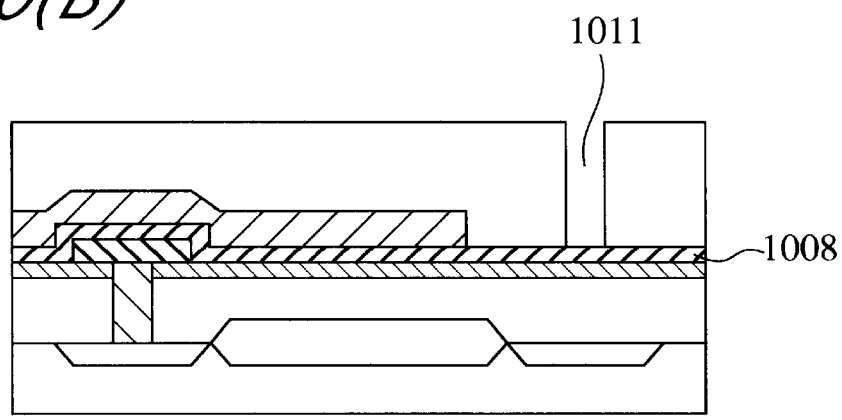
Figure 10C:
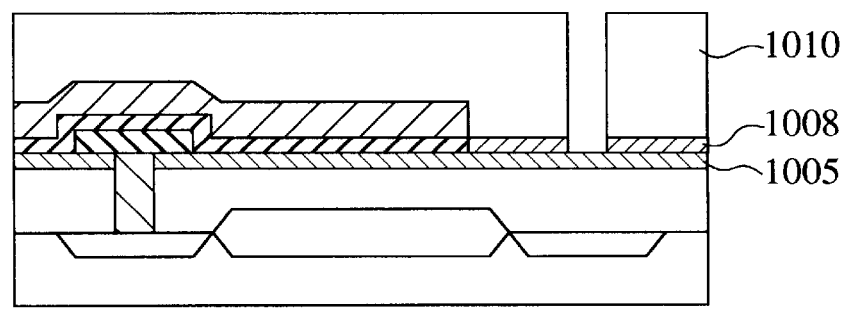
Figure 11A:
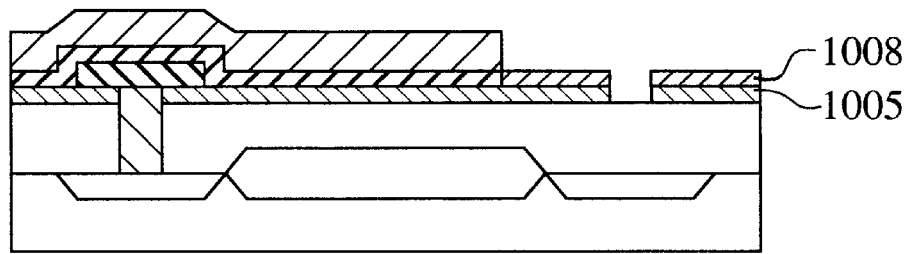
Figure 11B:
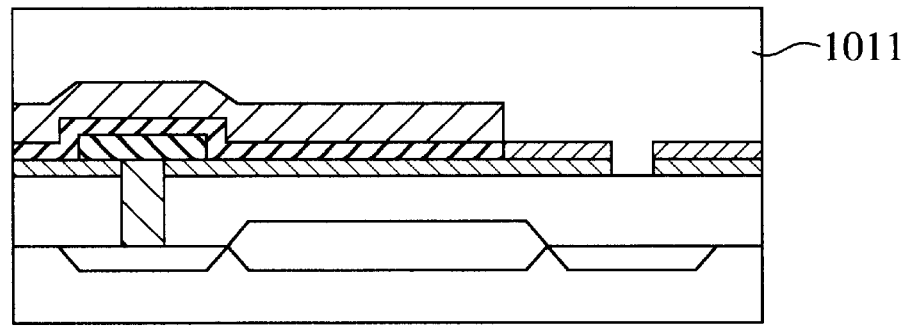
Figure 11C:
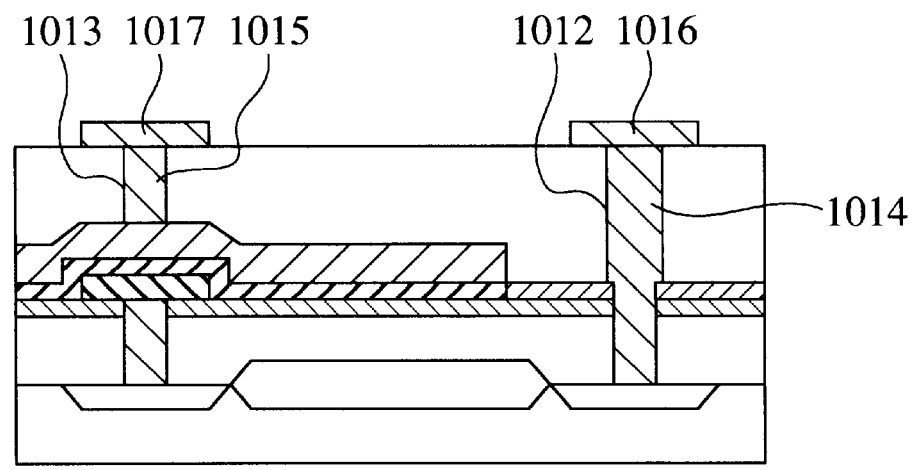
Figure 12:
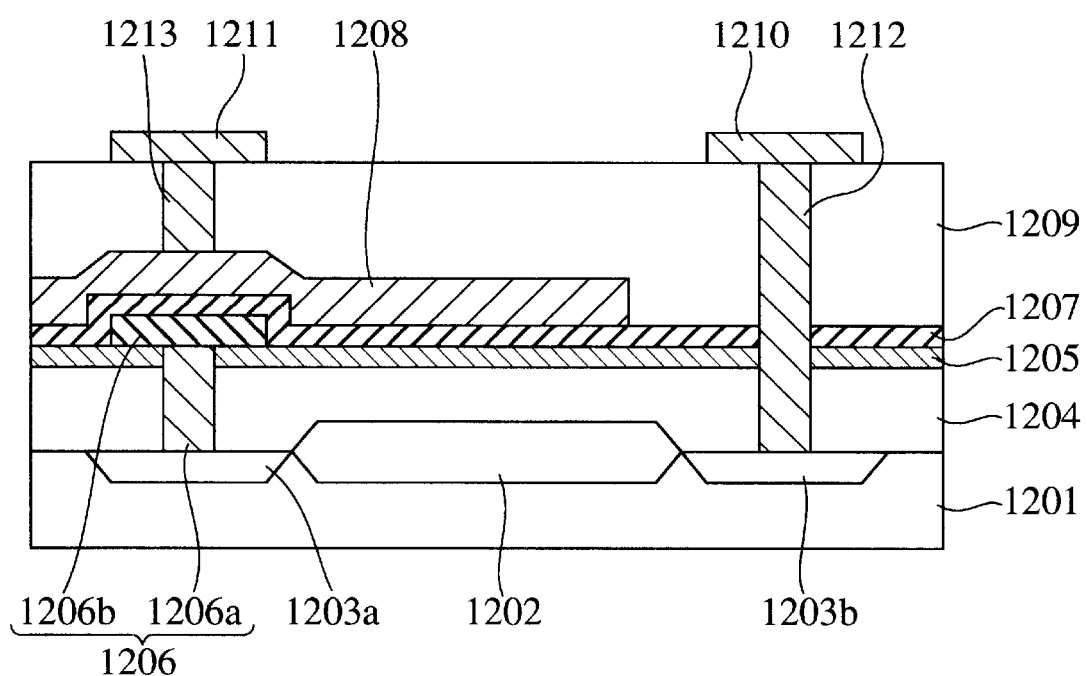
FIG. 12 is a cross-sectional view depicting the structure of major sections of a conventional semiconductor device.

FIG. 10 and FIG. 11 are cross-sectional views of the processes depicting a fabrication method for a DRAM in accordance with the fourth embodiment.

(1) First, a $SiO_2$ film 1002 to be a device isolation film, a diffusion layer 1003, a $SiO_2$ film 1004 to be a layer insulation film, and an amorphous SiN film 1005 are sequentially formed on the surface of a silicon wafer 1001, in the same manner as the above embodiments, then a contact hole 1006 is formed at the SiO$_2$ film 1004 and the SiN film 1005 by ordinary photolithography technology or the like. And the bottom electrode 1007 is formed by forming a layer interconnect film 1007a and a conductive layer 1007b that have the same configuration as those in the first embodiment.

Then a crystal BST film 1008, similar to the third embodiment, is formed. On the entire surface of this film 1008, a layer made from at least one of Ru, RuO$_2$, Ir, IrO$_2$ and Pt is formed using a sputtering method, CVD method or another method, such that the overall thickness becomes e.g. 30~200 nm, and the top electrode 1009, similar to the first embodiment, is formed by patterning.

Then a SiO$_2$ layer 1010 is formed on the entire surface by the CVD method or the like (see FIG. 10(A)).

(2) A throughhole 1011 is formed using ordinary dry etching technology or the like, such that a part of the BST film 1008 is exposed (see FIG. 10(B)).

(3) Ar ions or the like are implanted into the entire surface with a 10~20 kV acceleration voltage and $1\times10^{13}$~$1\times10^{15}$ dosage, for example. This applies ion bombardment on the exposed area of the crystal film 1008, and the area becomes amorphous.

Only the amorphous area of the film 1008 is removed by wet etching (see FIG. 10(C)). In this embodiment, too, a solution of hydrogen and ammonium fluoride (1:2) can be used as the etchant.

(4) An exposed area of the film 1005 is removed by RIE or the like, and then SiO$_2$ film 1010 is completely removed (see FIG. 11(A)).

(5) A SiO$_2$ film 1011 to be a layer insulation film is formed on the entire surface (see FIG. 11(B)).

(6) Finally, a contact hole 1012 and a throughhole 1013 are formed at the SiO$_2$ film 1011 using ordinary photolithography technology or the like. And after deposition polysilicon on the entire surface by such a method as sputtering, layer interconnect films 1014, 1015 and interconnect patterns 1016, 1017 are formed by patterning using ordinary photolithography or the like.

Thus in this embodiment, Ar ions are implanted into the specified area of the crystal BST film 1008 to alter the portion to be amorphous, and in the subsequent etching process, wet etching is performed using a solution of hydrogen and ammonium fluoride (1:2). Therefore in this embodiment, only a desired area of the BST film can be removed with a simple process.

As described above, the present invention allows removing a dielectric film of a capacitor to be formed in a semiconductor device easily and accurately using wet etching.

What is claimed is:

1. A fabrication method for a semiconductor device, comprising the steps of:

(a) forming a bottom electrode that has a layer interconnect film formed in a layer insulation film of a semiconductor substrate, and a conductive pattern formed on said layer insulation film contacting with the layer interconnect film;

(b) forming an amorphous or crystal dielectric film on said layer insulation film and on said conductive pattern;

(c) forming a top electrode at a specified area on said dielectric film;

(d) altering said dielectric film so that at least the area under said top electrode becomes crystalline and the other area becomes amorphous; and (e) removing a part or all of the amorphous area of said dielectric film by wet etching using an etchant with an etch rate for amorphous that is higher than the etch rate for crystal.

2. The fabrication method for a semiconductor device according to claim 1, wherein said step (b) is a step for forming said dielectric film, so that the area on said layer insulation film becomes amorphous, and said step (d) is a step for crystallizing only said dielectric film under said top electrode by heating this top electrode.

3. The fabrication method for a semiconductor device according to claim 2, wherein said heating is lamp heating.

4. The fabrication method for a semiconductor device according to claim 1, wherein said step (b) is a step for forming said crystal dielectric film, and said step (d) is a step for implanting ions after forming a mask that cover said top electrode, so that the ion-implanted area of said dielectric film is altered to be amorphous.

5. The fabrication method for a semiconductor device according to claim 4, wherein said ion implantation is argon ion implantation.

6. The fabrication method for a semiconductor device according to claim 1, wherein said step (e) is a step for removing a part or all of the amorphous area of said dielectric film by wet etching, for forming a throughhole at said layer insulation film.

7. The fabrication method for a semiconductor device according to claim 1, wherein said conductive pattern formed in said step (a) has a barrier layer which is formed to contact said layer interconnect film, and a layer made from one of Ru, RuO$_2$, Ir, IrO$_2$ and Pt which is formed on the barrier layer.

8. The fabrication method for a semiconductor device according to claim 1, wherein said dielectric layer formed in said step (b) is barium strontium titanate.

9. The fabrication method for a semiconductor device according to claim 1, wherein said step (e) is a step for performing wet etching using hydrogen and ammonium fluoride (1:2).

* * * * *